(12) United States Patent
Fujimoto

(10) Patent No.: US 6,613,684 B2
(45) Date of Patent: Sep. 2, 2003

(54) SEMICONDUCTOR DEVICE AND METHOD FOR FORMING CONTACT HOLES IN A SEMICONDUCTOR DEVICE

(75) Inventor: Mamoru Fujimoto, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/969,991

(22) Filed: Oct. 4, 2001

(65) Prior Publication Data

US 2002/0042202 A1 Apr. 11, 2002

(30) Foreign Application Priority Data

Oct. 5, 2000 (JP) ........................................ 2000/305675
Sep. 10, 2001 (JP) ........................................ 2001/273454

(51) Int. Cl.[7] .......................................... H01L 21/302
(52) U.S. Cl. ........................ 438/706; 438/710; 438/712
(58) Field of Search ................................ 438/706, 710, 438/712, 713, 720, 243, 244, 253, 254, 257, 290, 299, 631

(56) References Cited

U.S. PATENT DOCUMENTS 5,500,384 A * 3/1996 Melzner ..................... 438/631
6,285,053 B1 * 9/2001 Park ........................... 257/306
6,362,094 B1 * 3/2002 Dabbaugh et al. .......... 438/637

FOREIGN PATENT DOCUMENTS

JP 2000-133705 5/2000

* cited by examiner

Primary Examiner—Benjamin L. Utech
Assistant Examiner—Lan Vinh
(74) Attorney, Agent, or Firm—Volentine Francos, PLLC

(57) ABSTRACT

A protective film (14) on a conductor (11d), where a contact hole (22) is to be formed, is removed in advance in a forming process of an etched-away opening (20) to expose the top portion of the corresponding conductor (11d) from the top surface of an insulating film (15), which has buried therein the conductor (11d) covered with the protective film. The etched-away opening (20) is refilled with the same kind of material as that for the insulating film (15), and then two contact holes, one (21) that opens to the semiconductor substrate (10) substantially devoid of the protective film and the other (22) that opens to the conductor (11d), are formed by simultaneous etching under substantially the same condition.

20 Claims, 14 Drawing Sheets

SEMICONDUCTOR DEVICE AND METHOD FOR FORMING CONTACT HOLES IN A SEMICONDUCTOR DEVICE

DETAILED DESCRIPTION OF THE INVENTION

1. Field of the Invention

The present invention relates to a semiconductor device and a method for manufacturing a semiconductor device, and more particularly to a method for forming contact holes for conductive strips passing through an insulating film, such as an interlayer insulating film.

2. Description of Related Art

In semiconductor devices, including semiconductor elements, such as MOS transistors, when contact holes, which run through an insulating film, where the MOS transistors are buried, and which open to active regions on the semiconductor substrate, are formed between gate electrodes of a pair of MOS transistors on a semiconductor substrate, for example, they are generally formed by a self-aligned contact process.

According to the self-aligned contact process, a protective film of silicon nitride, for example, is formed to cover gate electrodes for MOS transistors on a semiconductor substrate, for example. Moreover, an insulating film of silicon oxide is formed to bury the gate electrodes along with the protective film in it. On this insulating film, wiring for a multi-layered structure is formed when necessary, and prior to this wiring work, to form contact holes that open to the semiconductor substrate between the gate electrodes, those regions of the insulating film which are located between the gate electrodes are subjected to an etching process using an etching mask and an etching gas to expose the above-mentioned regions between the gate electrodes.

Because the etching gas shows a notably low etching rate to the protective film than to the insulating film, the protective film serves to protect the gate electrodes from the etching gas during etching. When the side-wall portions of the protective film which cover the side walls of the gate electrodes are exposed in the course of the etching process, the side-wall portions function as etching stoppers, and contact holes can be formed between the gate electrodes with high accuracy regardless of placement accuracy of the etching mask, so that specified conductive property can be obtained by a conductive materials used to fill the contact holes.

Meanwhile, in conventional semiconductor devices such as have been mentioned above, it is often required to provide two contact holes: a contact hole that opens to the surface of the semiconductor substrate and another contact hole that opens to a conductor, such as a gate electrode under the protective film.

In the former, the contact hole can be formed by a single etching process in a specified position of the insulating film. In the latter, however, after the insulating film has been etched, the exposed protective film needs to be etched. Because the protective film has a different etching-resistant characteristic from that of the insulating film, their etching conditions differ to a large extent in the forming process of the two contact holes.

For this reason, in the conventional manufacturing method, it is necessary to separately carry out an etching process using a mask for the contact hole that opens to the surface of the semiconductor substrate, and an etching process using a mask for the contact hole that opens to the conductive line under the protective film. Therefore, it is necessary to set a relative position of the two masks for the different contact holes with accuracy.

In this respect, there has been requirement for a method for forming two contact holes with high accuracy and with improved facility.

To solve the above problem, the present invention adopts the following structure.

<Structure>

In manufacturing a semiconductor device having a semiconductor substrate, a conductor formed on the semiconductor substrate and covered with a protective film, and an insulating film deposited above the semiconductor substrate to cover the conductor, a method for forming a first contact hole running through the insulating film and opening to the surface of the semiconductor substrate or to an electric connection member buried in the insulating film, and a second contact hole running through both the insulating film and the protective film and opening to said conductor under the protective film, the contact-hole forming method comprises the steps of:

forming an etched-away opening running from the upper surface of the insulating film to expose the top portion of the conductor corresponding to the opening by using an etching medium exhibiting a higher etching rate to the protective film than to the insulating film to partially remove by etching the protective film on the conductor where the second contact hole is to be formed;

refilling the etched-way opening with a material of the same characteristic as the insulating film; and etching the layer of the insulating film that has been refilled with a single etching medium to thereby simultaneously form the first contact hole opening to the semiconductor substrate or the electric connection member buried in the insulating film, and the second contact hole opening to the conductor.

According to the above method of the present invention, the protective film above the conductor, where the second contact hole is to be formed, is removed in advance, when the etched-away opening is formed to expose the top portion of the corresponding conductor from the surface of the insulating film, and the etched-away opening is refilled. Under this condition, it is possible to form the second contact hole substantially under the same condition as in etching of the first contact hole.

Moreover, in the formation of the etched-away opening, because an etching medium is used which exhibits a greater etching rate to the protective film than to the insulating film, the etched-away opening does not have its circumferential wall become like a beer barrel or taper off nor does it incur an etching stoppage at the interface between the insulating film and the protective film caused by a change of the kind of etching medium, so that the protective film can be etched so as to have specified parts appropriately removed.

Therefore, according to the above-mentioned method of the present invention, a final etching process to form the first and second contact holes after refilling of the etched-away opening can be carried out substantially under the same condition, and therefore both contact holes can be formed collectively by an etching process using a single etching mask having arranged therein two opening patterns for the first and second contact holes.

The above-mentioned conductors include gate electrodes or signal lines of field-effect semiconductor devices formed on a semiconductor substrate-and various kinds of conductive parts formed on the semiconductor substrate.

The etching rate of the etching medium with respect to the protective film can be made 1.3~2.0 times that of the insulating film.

When the insulating film is silicon oxide and the protective film is a silicon nitride film used as an etching stopper in a self-aligned contact process, a mixed gas of $CHF_3$ and CO as the etching medium.

To solve the problem, a typical example of a semiconductor device according to the present invention comprises a substrate; a conductor located on the substrate; a protective film provided in such a way that the protective film contacts sides of the conductor and a height of the protective film from the substrate at a portion apart from the sides is higher than a height of the protective film from the substrate at a portion where said protective film ontacts the sides; an insulating film formed on the substrate including the conductor; contact holes formed in the insulating film up to a top surface of the conductor; and electric connections provided in the contact holes and to be electrically connected to the conductor.

In addition, another method for forming contact holes according to the present invention comprises the steps of forming a plurality of conductors, located apart from one another, on a substrate where a semiconductor element is formed, and forming a protective film on sides and top surfaces of the conductors; forming an insulating film on the substrate including the conductors; and forming an etching mask on the insulating film and performing etching with the etching mask to thereby form a first contact hole in the insulating film on the substrate to expose the semiconductor element located between the conductors and form a second contact hole in the insulating film on said conductors to expose the top surfaces of said conductors, the method further comprising, before forming the insulating film: forming a coating film on the substrate, which has a thickness approximately equal to or smaller than a sum of a thickness of the conductors and a thickness of the protective film formed on the top surfaces of the conductors and has an etching rate lower than an etching rate of the protective film; forming, on the coating film and the protective film, a resist mask having openings to expose the protective film on the top surfaces of said conductors where the second contact hole is formed; removing the protective film on the top surfaces of the conductors where the second contact hole is formed by performing etching using the resist mask; and removing the resist mask and the coating film after removing the protective film.

DESCRIPTION OF THE EMBODIMENTS

Figure 1A:
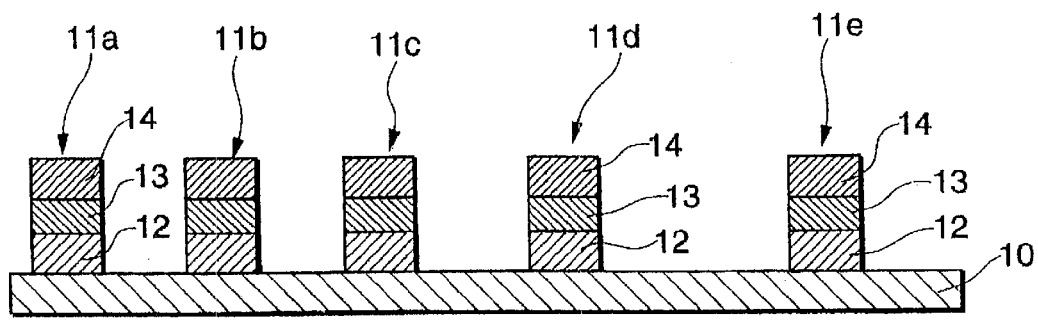
FIGS. 1(*a*) to 1(*d*) show a manufacturing process in a first embodiment of the method for forming contact holes according to the present invention (Part 1)

The present invention will be described in detail by referring to preferred embodiments illustrated in the accompanying drawings.

<Embodiment 1>

FIGS. 1 and 2 show a first embodiment of a semiconductor device manufacturing process according to the present invention.

As shown in FIG. 1(*a*), a plurality of gate electrodes 11 (11*a* to 11*e*) for MOS transistors are formed in parallel and mutually spaced apart in an active region of a silicon semiconductor substrate 10, for example.

In the illustrated example, each gate electrode 11 has a well-known multi-layered structure including a polysilicon layer 12 containing impurity atoms and a tungsten silicide layer 13 (provided for increased electric conductivity), and is covered at the top surface with a protective film 14 of a silicon nitride, for example. Those gate electrodes 11 are provided by depositing polysilicon and silicide in this order on the substrate 10, for example, through an intermediary of a well-known gate electrode not shown, then forming a protective film 14 of silicon nitride on the stacked structure by photolithography, and subsequently removing unwanted portions of the stacked structure and the gate oxide film by selective etching with the protective film used as the etching mask.

Though not illustrated, by using the gate electrodes 11 each having a protective film 14 at the top portion as a mask, impurity atoms to form the source and drain regions are injected into the substrate 10 on either side of the gate electrodes 11 by ion implantation, for example.

After the source and drain regions corresponding to the gate electrodes 11 are formed, as shown in FIG. 1(*b*), a silicon nitride film of the same material as that of the above-mentioned protective film 14 is deposited by CVD, for example, to cover each gate electrode 11.

By the deposition of the silicon nitride material of the side-wall portions 14*b* to cover the side walls of the gate electrodes 11 are formed in a manner continuous with the top portions 14*a* of the protective films 14, and bottom portions 14*c* with a thin thickness are formed between the gate electrodes 11 on the substrate 10 in a manner continuous with the side-wall portions 14*b*. As a result, the thickness of the top portions 14*a* of the protective film 14 increases by an amount corresponding to the thickness of the bottom portions 14*c*.

After the silicon nitride film has been deposited, as shown in FIG. 1(*c*), to bury the silicon nitride film, an interlayer insulating film 15, of a silicon oxide film, for example, is formed. The surface of the interlayer insulating film 15 is subjected to a planarization process. To form contact holes, which open to the source and drain regions in the active region of the substrate 10 between desired gate electrodes 11, an etching mask 16 having openings 16a that correspond to desired contact holes is formed on the planarized surface of the insulating film 15 by a self-aligned contact process. In the example illustrated, self-aligned contact holes are formed respectively between the gate electrodes 11a and 11b and between the gate electrodes 11b and 11c.

The insulating film 15 is etched by selective etching with the etching mask 16. As an etching medium, a CF-based etching gas, for example, is used.

This etching gas exhibits a sufficiently higher etching rate to the insulating film 15 of silicon oxide than to the protective film 14 of silicon nitride. Therefore, when those portions of the insulating film 15 which correspond to the openings 16a, 16a of the etching mask 16 are removed and consequently some parts of the top portions 14a, the side-wall portions 14b and the bottom portions of the protective film 14 are exposed to the etching gas, the bottom portions 14c of thin thickness are removed in a relatively short time, but the top portions 14a and side-wall portions 14b except for the bottom portions 14c remain after the portions between the side-wall portions 14b of the insulating film 15 have been removed.

As has been well known, the top portions 14a and the side-wall portions 14b of the protective film 14 function substantially as etching stoppers. Therefore, as shown in FIG. 1(d), desired self-aligned contact holes 17, 17 are formed with high accuracy between the gate electrodes 11 by the etching stopper action of the protective film 14 provided in conjunction with the gate electrodes regardless of the placement accuracy with which the etching mask 16 is placed.

Plugs 18 are formed to fill up the contact holes 17, 17. The plugs 18 are made of impurity-doped polysilicon, for example, and serve as conductors. After the plugs 18 are formed, the etching mask 16 is removed.

Figure 2A:
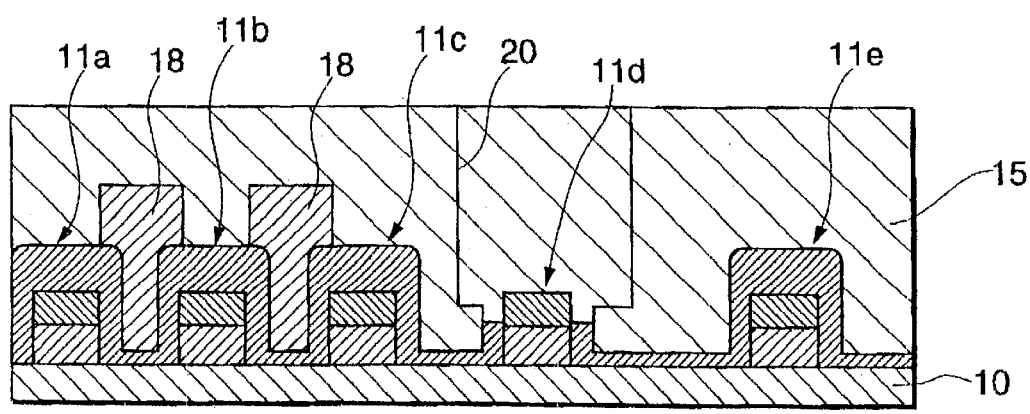
FIGS. 2(*a*) and 2(*b*) show a manufacturing process in the first embodiment of the method for forming contact holes according to the present invention (Part 2)
Figure 2B:
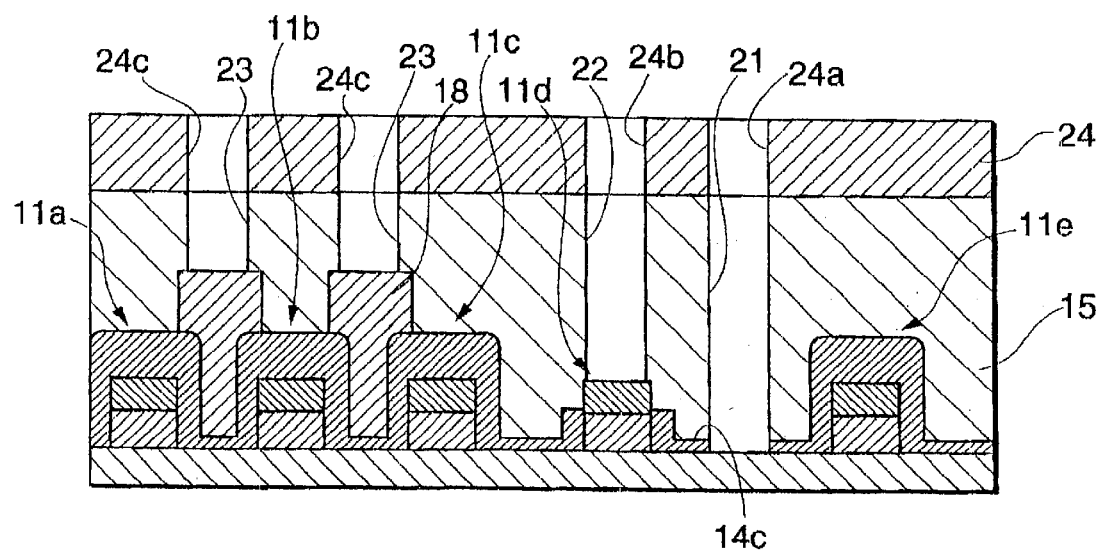

After this, a first contact hole 21 (refer to FIG. 2(b)) that opens to the active region of the substrate 10 and a second contact hole 22 (refer to FIG. 2(b)) that opens to the gate electrode 11 as a conductor are formed without using the above-mentioned self-aligned contact process. Before the contact holes 21 and 22 are formed, the protective film 14 is removed which is on the desired gate electrode 11 where the second contact hole 22 is to be formed.

Figure 1B:
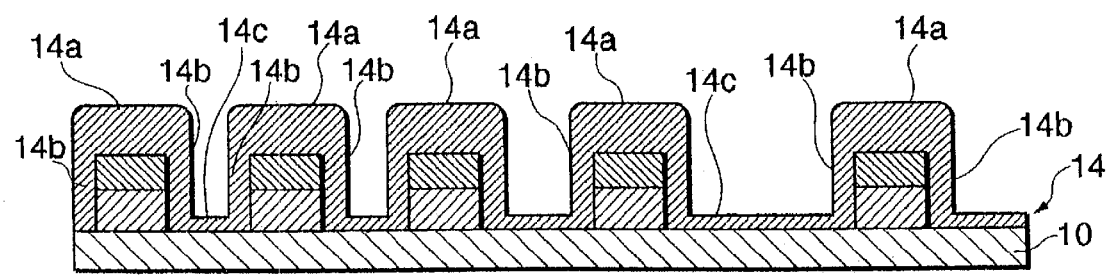
Figure 1C:
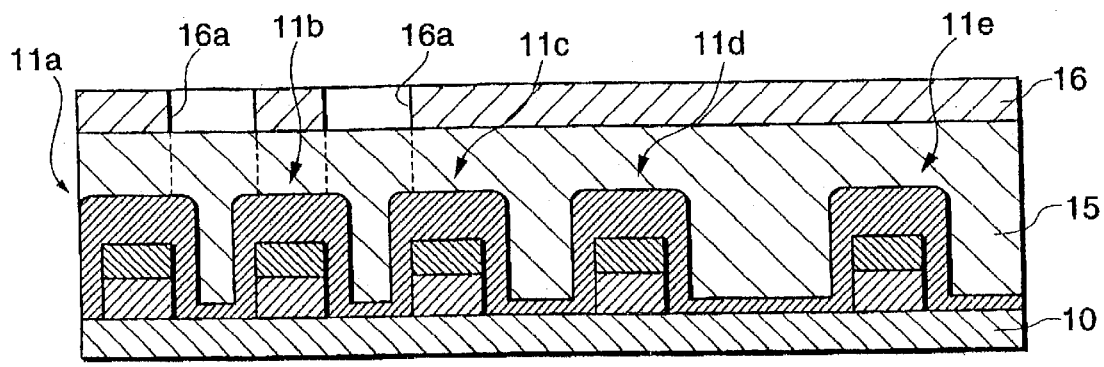
Figure 1D:
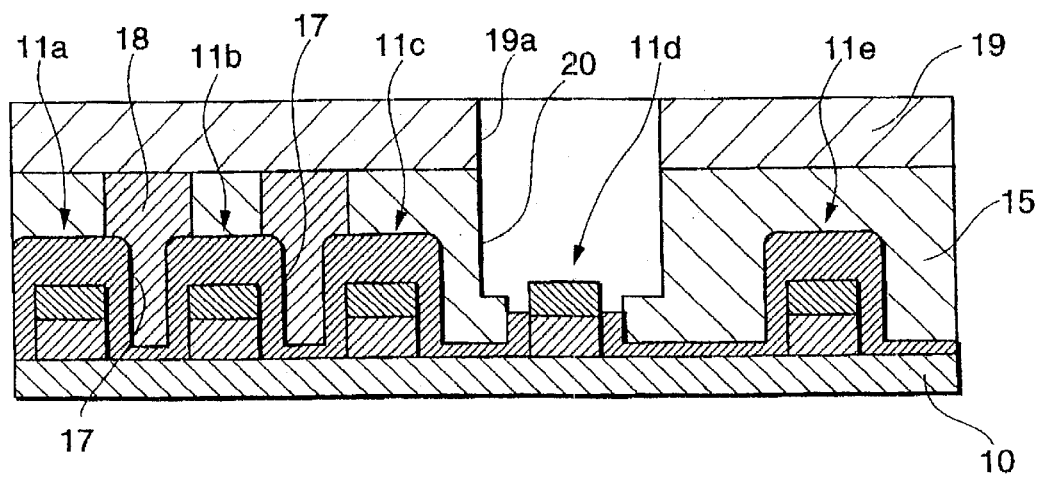

As shown in FIG. 1(d), when the above-mentioned second contact hole 22 is formed on the gate electrode 11d, for example, the surface of the insulating film 15 is subjected to a planarization process, and an etching mask 19 having an opening 19a to partially expose that portion of the insulating film which is located above and corresponds to a desired gate electrode 11d is formed on the planarized surface of the insulating film 15.

The diameter of the opening 19a of the etching mask 19 is preferably sufficiently larger than the width dimension of the gate electrode 11d.

An etched-away opening 20 is formed in the insulating film 15 by removing that portion of the insulating film 15 which is located above the gate electrode 11d by etching with the mask 19 mentioned above.

In the above etching, a mixed gas of $CHF_3$ and CO, for example, is used as an etching medium. This etching gas exhibits a higher etching rate to the protective film 14 of silicon nitride than to the insulating film 15 of silicon oxide.

Therefore, by suitably setting the composition of components of this etching gas, it is possible to obtain an etching gas which has an etching rate of 1.3, for example, with respect to the protective film 14 when the etching rate to the insulating film 15 is 1.

In etching using the above-mentioned etching gas, the insulating film 15 is etched away partially, and when the protective film 14 of the gate electrode 11d is exposed as the etching process proceeds, the protective film 14 is etched faster than the insulating film 15.

Consequently, as shown in FIG. 1(d), an etched-away opening 20 is formed as an extension of the opening 19a of the etching mask 19, and the gate electrode 11d can be exposed under the condition that the unwanted protective film 14 has been removed from the etched-away opening. In the example in FIG. 1(d), the protective film 14 has had removed its top portion 14a of the gate electrode 11d as well as upper halves of its side-wall portions 14b, which were continuous to the top portion.

In the forming process of the etched-away opening 20, the insulating film 15 and the protective film 14 react to the etching gas at their etching rates mentioned above, and therefore the insulating film does not react so strongly as the protective film 14. Accordingly, the etched-away opening 20 does not become like a beer barrel with the circumferential wall swelling outward at its middle portion nor does it-taper off downwardly as it has a relatively large diameter. Therefore, an adequate opening 20 aligned with the opening 19a of the etching mask 19 can be formed by etching.

By using an etching gas which has a higher etching rate to the protective film 14 than to the insulating film 15, the opening 20 is hindered from intruding into the substrate 10, which would otherwise be caused by excessive removal of the insulating film 15.

By this forming process of the etched-away opening 20, the insulating film 15 and the protective film 14 can be removed by using a single kind of etching gas, so that it is not necessary to change over the etching gas. Therefore, a carbide film, which conventionally occurs by a changeover of the etching gas, is prevented from forming on the protective film. Thus, the etching stoppage caused by the carbide film, which is a commonplace phenomenon, is prevented, with the result that the etched-away opening 20 can be formed suitably, and the gate electrode 11d without the protective film 14 can be exposed in the opening 20.

The ratio of components of this etching gas should preferably be selected suitably so that the etching rate of the protective film 14 is in the range of 1.3 to 2.0 when the etching rate of the insulating film 15 is 1.

After the etched-away opening 20 is formed, the etching mask 19 is removed. Subsequently, as shown in FIG. 2(a), silicon oxide, which is the same material for the insulating film 15, is deposited. By this deposition, the plugs 18 are buried and the etched-away opening 20 is refilled.

After refilling the etched-away opening 20, the surface of the insulating film 15 is subjected to a planarization process. After this, as shown in FIG. 2(b), on the insulating film 15, an etching mask 24 is formed, which has openings 24a and 24b formed respectively to form the first contact hole 21 to open to the active region of the substrate 10 and the second contact hole 22 to open to the gate electrode 11, with the protective film 14 eliminated. Those openings 24a and 24b are located between the gate electrodes 11d and 11e.

In the illustrated example, in the etching mark 24, there are formed the openings 24c, 24c for third contact holes 23, 23 extending to the tops of the plugs 18, 18.

In the etching process of the insulating film 15 using the above-mentioned etching mask 24, a CF-based etching gas, such as the one used in forming the contact holes 17.

In the etching process to form the contact holes 21, 22, 23, 23 using the etching mask 24, the protective film 14 is not involved in the formation of the contact holes 22, 23, 23 with the exception of the first contact hole 21. In the formation of the first contact hole 21, the bottom portion 14c of the protective film 14 is involved in the process; however, as-described above, the bottom portion 14c of thin thickness can be removed easily by the CF-based etching gas mentioned above.

Therefore, as shown in FIG. 2(b), by the etching process using a single etching mask 24 and a single etching gas, those contact holes 21 to 23, including the first and second contact holes 21 and 22 can be formed collectively.

Conductive lines, not shown, filling up the contact holes like the plugs 18 are formed in the contact holes 21, 22 and 23, and conductors as components of multi-layer wiring are formed on the insulating film 15 after the etching mask 24 is removed.

According to the method for forming the contact holes, as described above, the etched-away opening 20 is formed in conjunction with a specified gate electrode 11d, during which process the protective film 14 related to the specified gate electrode 11d is removed, and then the etched-away opening 20 is refilled with the same material as the material for the insulating film 15. By carrying out the final etching process using a single etching mask 24, which is made possible by those preparatory steps, such as refilling the opening 20, it is possible to collectively form the contact holes, including the first contact hole 21 that opens to the active region of the substrate 10 and the second contact hole 22 that opens to the gate electrode 11.

In the above-mentioned method for forming the contact holes, the contact holes, including the first and second contact holes 21 and 22 corresponding to the openings 24a and 24b of the etching mask 24 can be formed with high precision relatively easily as it becomes unnecessary to align the positions of the mask for the first contact hole 21 and the mask for the second contact hole 22.

As the materials for refilling the etched-away opening 20, instead of using the same material as with the insulating film 15, it is possible to use an electrical insulating material with an etching-resistant characteristic almost the same as in the insulating film 15.

In the first embodiment, description has been made of the method for forming contact holes according to the present invention. Description will next be made of an example in which the method for forming contact holes according to the present invention is applied to conductors such as bit lines by referring to FIGS. 3 and 4.

<Embodiment 2>

FIGS. 3 and 4 shows a second embodiment of the semiconductor device manufacturing process according to the present invention.

Figure 3A:
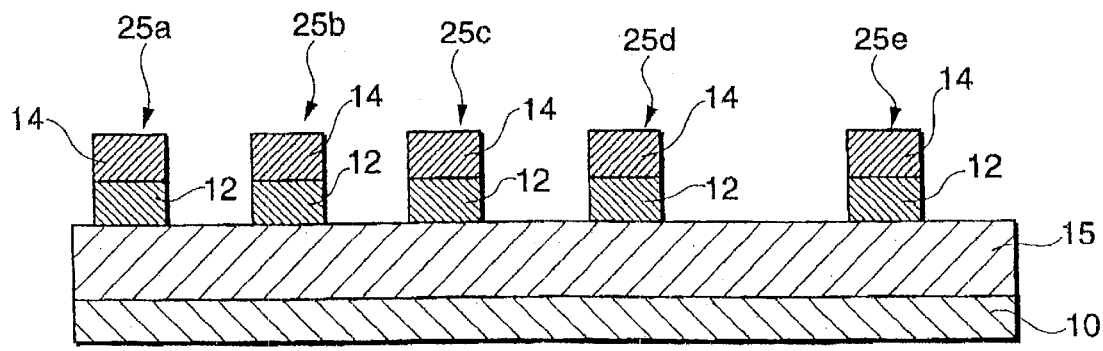
FIGS. 3(*a*) to 3(*d*) show a manufacturing process in a second embodiment of the method for forming contact holes according to the present invention (Part 1)

As shown in FIG. 3(a), a plurality of signal lines 25 (25a~25e) for transmitting electric signals are formed in parallel and mutually spaced apart on the interlayer insulating film 15 covering the silicon semiconductor substrate 10, for example.

The signal lines 25 are bit lines of memory. In the insulating film 15 under the bit lines, the gate electrodes 11 (11a~11e) are arranged in a direction at right angles with the signal lines. Those gate electrodes 11 are shown in FIGS. 1 and 2 but they are not illustrated here for simplicity of drawing.

The signal lines 25 are formed by forming an impurity-doped polysilicon layer 13 on the insulating film 15, then forming a protective film 14 of silicon nitride on the polysilicon layer by photolithographic etching and removing the polysilicon layer 13 by selective etching with the protective film used as the mask.

Figure 3B:
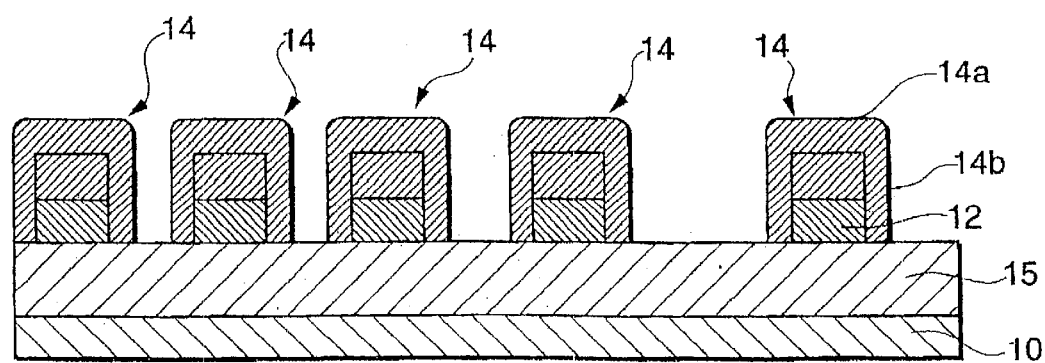

As shown in FIG. 3(b), by deposition of the same material as that for the protective films 14 formed over the top portions of the signal lines, the top portions 14a of the protective film 14 and the side-wall portions 14b, which are continuous to the top portions and covering the side portions of the signal lines 25, are formed, so that the signal lines 25 are covered with the top portions 14a and the side-wall portions 14b of the protective film 14.

Figure 3C:
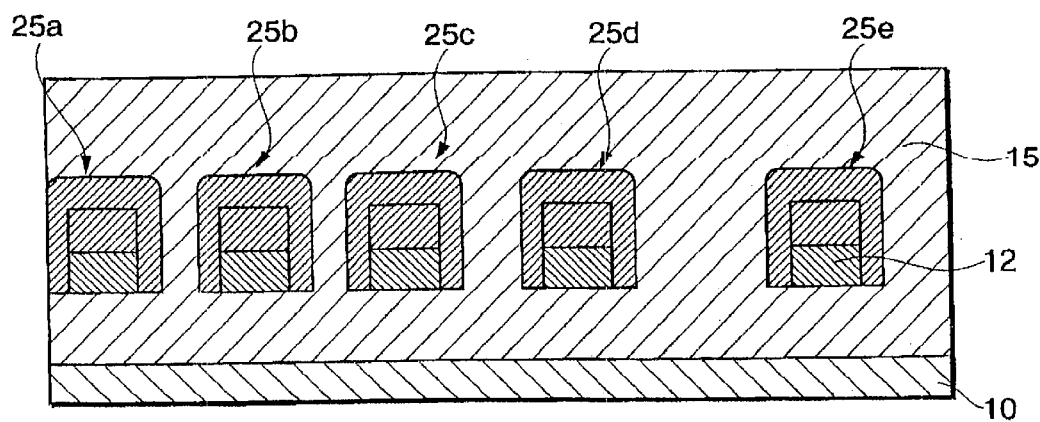

After the tops and the sides of the signal lines 25 are covered with the protective film 14, the silicon oxide material of the insulating film 5 is additionally deposited. By this additional deposition of the material, as shown in FIG. 3(c), the signal lines 25 covered with the protective film 14 are buried in the insulating film 15.

Figure 3D:
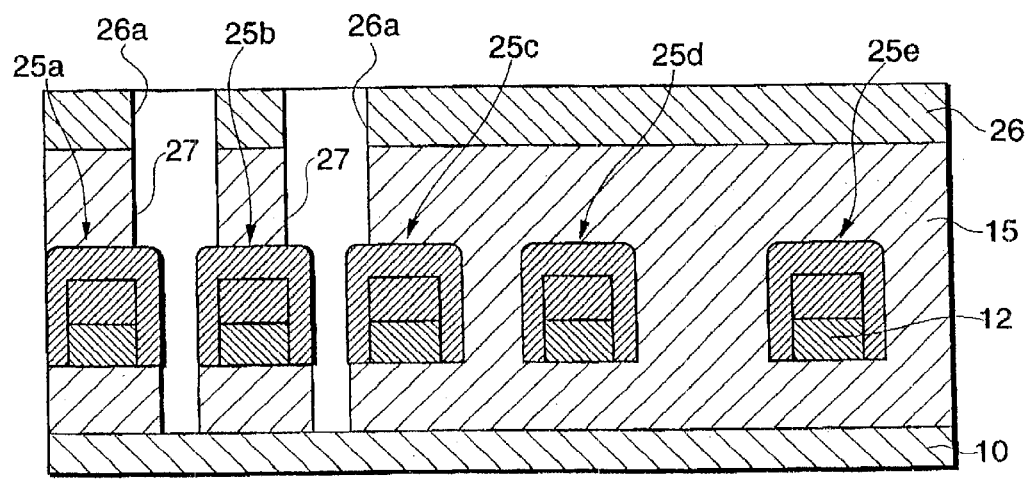

After this, as shown in FIG. 3(d), on the insulating film 15, which has been made flat by a planarization process, an etching mask 26 is formed, which has opening 26a, 26a corresponding to desired contact holes, to form, by a self-aligned contact process, contact holes that open to the source and drain regions in the active region of the substrate 10 between desired signal lines 25.

In this illustrated example, self-aligned contact holes are formed respectively between the signal lines 25a and 25b and between the signal lines 25b and 25c.

Then, the insulating film 15 is etched by selective etching using the etching mask 26. As an etching medium for the etching process, a CF-based etching gas, which has been used in the preceding example, may be used.

With respect to this etching gas, as mentioned above, the top portions 14a and the side-wall portions 14b of the protective film 14 work substantially as etching stoppers. Therefore, as shown in FIG. 1(d), desired self-aligned contact holes 27 that extend to the substrate 10 are formed with high accuracy between the signal lines 25 by the etching stopper action of the protective film 14 as described above the placement accuracy or inaccuracy with which the etching mask 26 is placed.

Figure 4A:
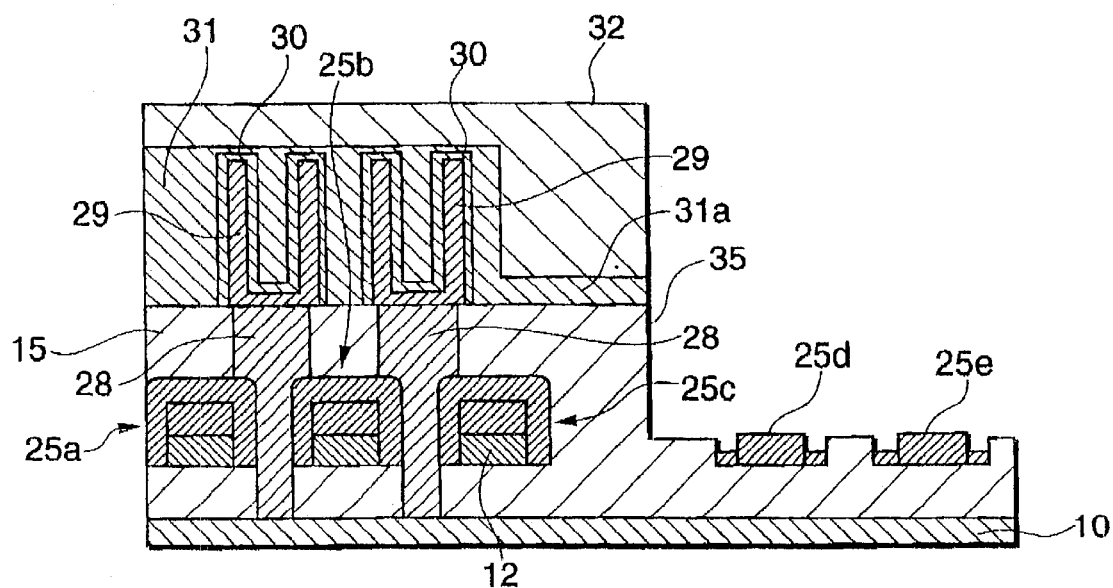
FIGS. 4(*a*) to 4(*c*) show a manufacturing process in the second embodiment of the method for forming contact holes according to the present invention (Part 2)

As shown in FIG. 4(a), plugs 28 like those provided in the contact holes 27 are formed, and storage nodes 29, a dielectric film 30 covering the storage nodes 29, and a conductive layer 31, where the storage nodes 29 covered with the dielectric film 30 are buried, are formed as the components of capacitors built in conjunction with the plugs 28. The capacitor of a memory cell is formed by a storage node 29 and the conductive layer 31 having the dielectric film 30 between them.

The conductive layer 31 of the memory cell capacitor has an electric connection member 31a extending onto the insulating film 15. The conductive layer 31 is formed by a remainder of the deposited material for the conductive layer 31 after the unnecessary portions of the conductive layer 31 have been etched away by selective etching using the mask 32.

After the conductive layer 31 is patterned as mentioned above, before a first contact hole 33 (FIG. 4(c)) that opens to the conductive layer 31 and second contact holes (FIG. 4(c)) that open to the signal lines 25d and 25e as conductors are formed without using the above-mentioned self-aligned contact process, the protective layers 14 on the second signal lines 25d and 25e, on which the second contact holes 34 are provided, are removed by using the mask 32 for patterning of the conductive layer 31.

In this removal of the protective film 14, a mixed etching gas of $CHF_3$ and CO, for example, is used which is used in forming the etched-away opening 20 as mentioned above. This etching gas, as described above, exhibits a higher etching rate with the protective film 14 of silicon nitride than with the insulating film 15 of silicon oxide. Therefore, in the etched-away opening 35, the signal lines 25d and 25e are exposed without the insulating film 15 being removed excessively.

Figure 4B:
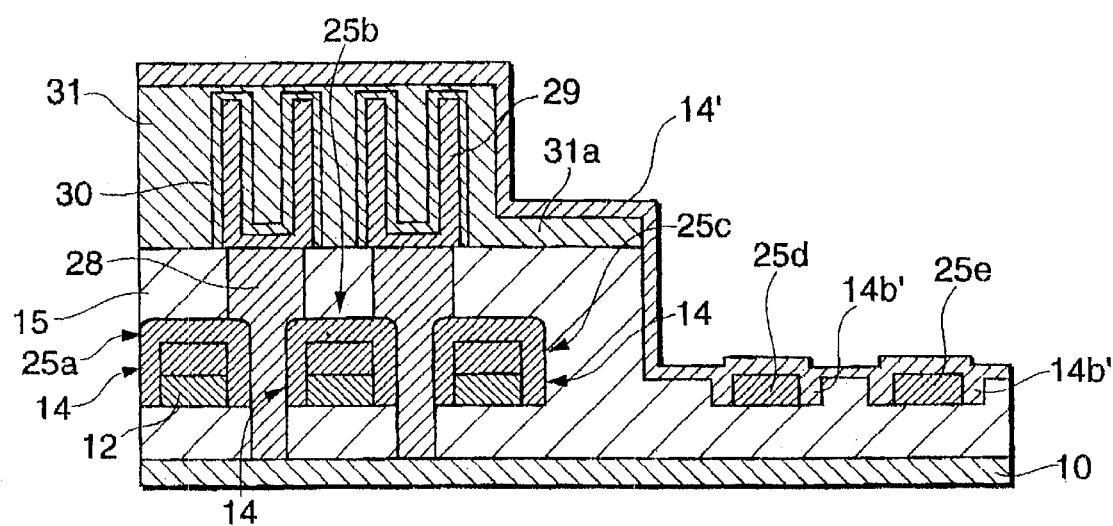

In the example shown in FIG. 4(a), after the signal lines 25d and 25e are exposed, the remaining portions 14b' of the side-wall portions 14b reduced in height exist on either side of the signal lines. In order to use remaining portions 14' as etching stoppers in etching of the second contact holes 34, after the mask 32 is removed, silicon nitride 14' is deposited additionally on the exposed conductive layer 31 and on the insulating layer 15 including the signal lines 25d and 25e as shown in FIG. 4(b).

This additional silicon nitride film 14' has a thin thickness as in the bottom portions 14c of the protective film 14 shown in FIG. 1(b), but by the deposition of additional silicon nitride, the thickness of the remaining side-wall portions 14b' left around the signal lines 25d and 25e grow in thickness by the amount of the silicon nitride film 14' additionally deposited.

Figure 4C:
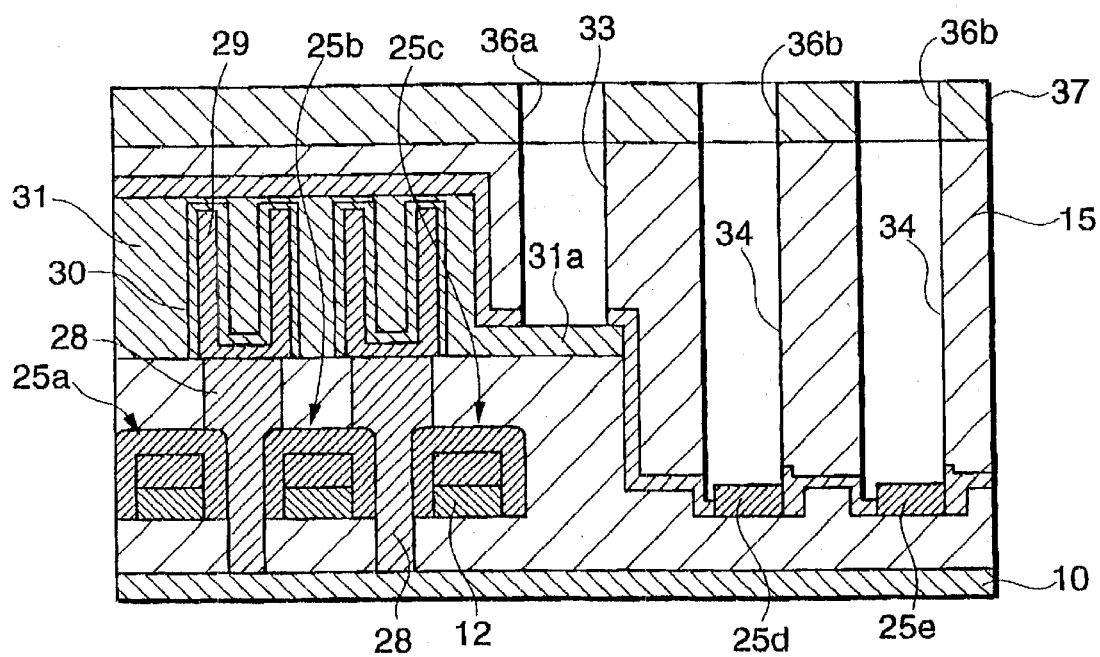

As shown in FIG. 4(c), the same depositing material as that for the insulating film 15 is deposited on the silicon nitride film 14', thereby refilling the etched-away opening 35. Subsequently, after the surface of the refilled insulating film 15 has been planarized, on the insulating film, an etching mask 37 is formed which has openings 36a and 36b for forming the first contact hole 33 that opens to the electric connection member 31a and the second contact holes 34, 34 that open to the signal lines 25d and 25e.

When etching the insulating film 15 with the etching mask 37, a CF-based etching gas, for example, is used which has been used when etching the contact holes 17, 17.

In the etching process to form the contact holes 33 and 34, 34 using the etching mask 37, there is the silicon nitride film 14' of thin thickness, subjected to etching, on the electric connection member 31a and on the signal lines 25d and 25e. Being thin in thickness, the thin-thickness silicon nitride film 14' can be removed easily and does not function substantially as an etching stopper.

In contrast, the remainder 14b' of the side-wall portions made of silicon nitride left behind on either side of the signal lines 25d and 25e, because of its increased height, function as an etching stopper to securely prevent unwanted etch-away losses of the insulating film 15 on either side of the signal lines 25 and 25e due to a placement error of the etching mask 37 mentioned earlier.

According to the method for forming contact holes according to the present invention described with reference to the second embodiment, as mentioned above, the first contact hole 33 that opens to the electric connection member 31a, and the second contact holes 34, 34 that open to the signal lines 25d and 25e can be formed collectively by a final etching process using a single etching mask by steps of forming the etched-away opening 35 in conjunction with the specified signal lines 25d and 25e, removing in advance the protective in conjunction with the specified signal lines 25d and 25e, and then refilling the etched-away opening 35 with the same material as that for the insulating film 15.

Therefore, the contact holes 33 and 34 corresponding to the openings 36a and 36b of the etching mask 37 can be formed with high accuracy relatively easily.

Thus, it is unnecessary to deposit the silicon nitride film 14', for which reason the involvement of a different kind of material in etching of the insulating film 15 can be avoided, making is possible to carry out more easily the final etching process for the first contact hole 33 and the second contact holes 34, 34 using the etching mask 37.

<Embodiment 3>

In the first and second embodiments, description has been made of examples in which the first and second contact holes are formed separately. However, as shown in FIG. 5, the first and second contact holes can be formed as a common contact hole.

Figure 5A:
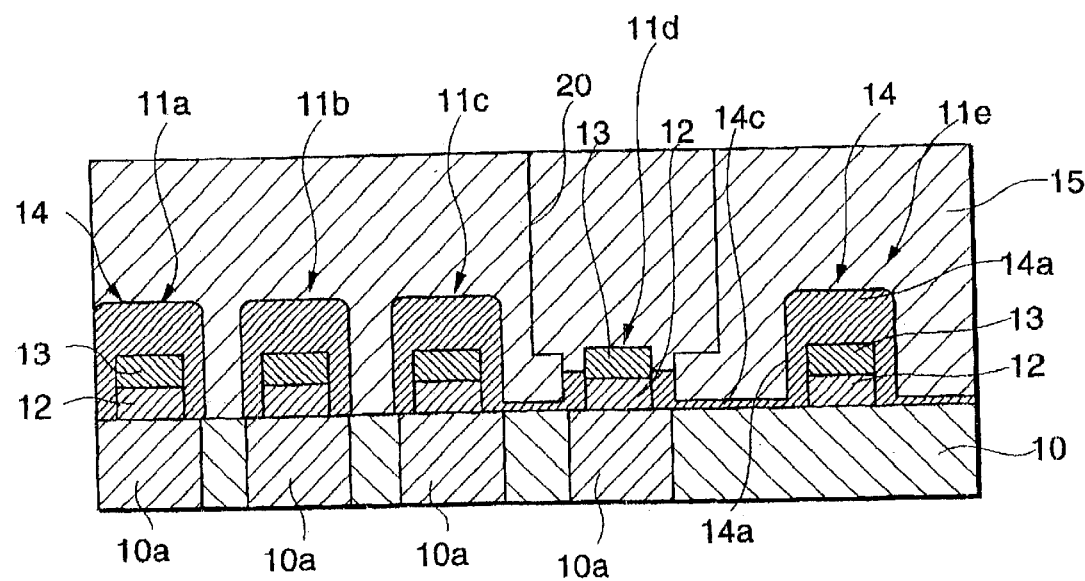
FIGS. 5(*a*) and 5(*b*) show a manufacturing process in a third embodiment of the method for forming contact holes according to the present invention.

As shown in FIG. 5(a), the gate electrodes 11 (11a to 11e) are formed on the semiconductor substrate 10 in the same way as in FIG. 2(a) showing the first embodiment. The protective film 14 of the gate electrode 11d, out of those gate electrodes 11, is partially removed by the formation of the etched-away opening 20 by etching using a mixed gas of $CHF_3$ and CO, which has been used for the insulating film 15, thereby temporarily exposing the tungsten silicide portion of the gate electrode 11d, and after this the etched-away opening 20 is refilled with a silicon oxide material.

Figure 5B:
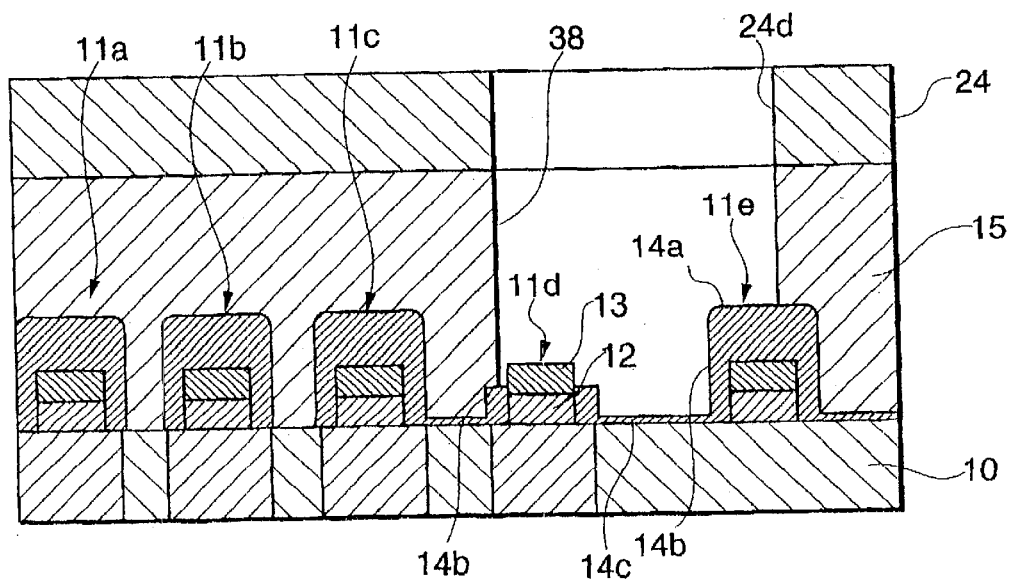

In FIGS. 5(a) and 5(b), the isolation regions 10a are shown, which delimit the active regions of the substrate 10, and the same reference numerals designate the same or like components as in FIG. 2(a), though the plugs 18 shown in FIG. 2(a) are not illustrated.

In FIGS. 5(a) and 5(b), the isolation regions 10a are shown as located under the gate electrodes 11, but actually the gate electrodes 11 are formed so as to be located on the active regions in positions shifted below or above the plane of this paper.

After the etched-away opening 20 has been refilled, the surface of the insulating film 15 is made flat by a planarization process. After this, as shown in FIG. 5(b), on the insulating film 15, an etching mask 24 is formed having an opening 24d including the gate electrode 11d and the left-half portion, as shown, of the gate electrode 11c.

In etching of the insulating film 15 using the etching mask 24, a CF-based etching gas, for example, is used which has been used in forming the contact holes 17, 17 in the first embodiment.

In the etching using the etching mask 24, an enlarged contact hole 38, which corresponds to the opening 24d of the etching mask 24, is formed in the insulating film 15 so that the enlarged contact hole 38 includes the gate electrode 11d and the region between the gate electrode 11d and the gate electrode 11e.

In the etching of the enlarged contact hole 38, out of a pair of side-wall portions 14b remaining around the gate electrode 11d, one side-wall portion 14b located at a lower end of the wall of the hole 38 prevents unacceptable damage to the substrate 10 caused by an inaccurate placement of the etching mask 24. Moreover, out of the protective film 14 of the gate electrode 11e, its top portion 14a and that part of the side-wall portion 14b which is exposed in the etching mask 37 functions as etching stoppers and serves to give a self aligned contact.

On the other hand, that thin-thickness bottom portion 14c of the protective film 14 which is located between the gate electrodes 11d and 11e does not function as an etching stopper as described earlier.

Thus, the enlarged contact hole 38 opens to the gate electrode 11d, from which the protective film 14 has been removed, and at the region between the gate electrode 11d and the gate electrode 11e and therefore functions as a common contact hole for the first and second contact holes (21 and 22).

A common contact hole such as this is advantageous in forming electrical short-circuit plugs.

In the description made so far, an insulating material, a protective film and an etching gas of specific kinds have been used, but they have been shown not for restrictive but for illustrative purposes, and various materials may be selected without departing from the spirit and scope of the present invention.

<Embodiment 4>

Figure 6A:
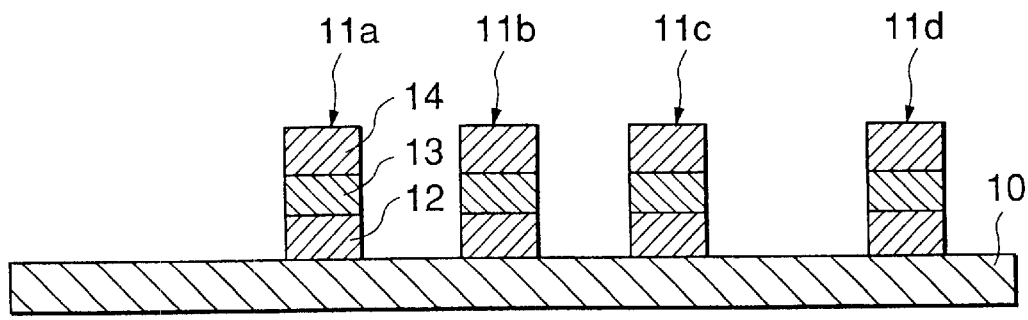
FIGS. 6(*a*) to 6(*c*) show a manufacturing process in a fourth embodiment of the method for forming contact holes according to the present invention (Part 1)
Figure 6B:
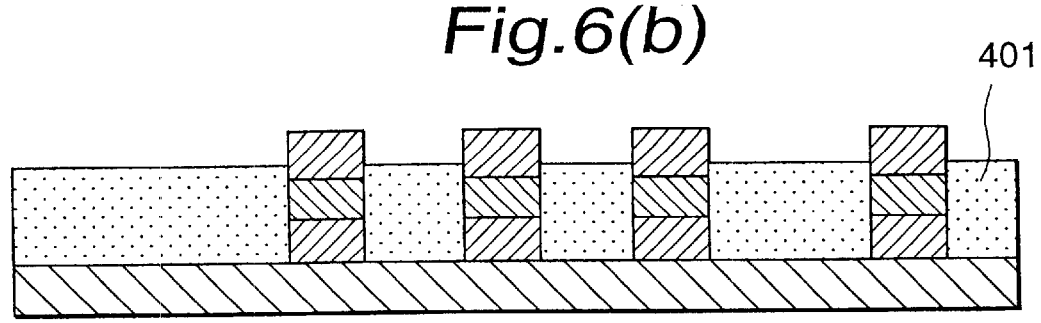
Figure 6C:
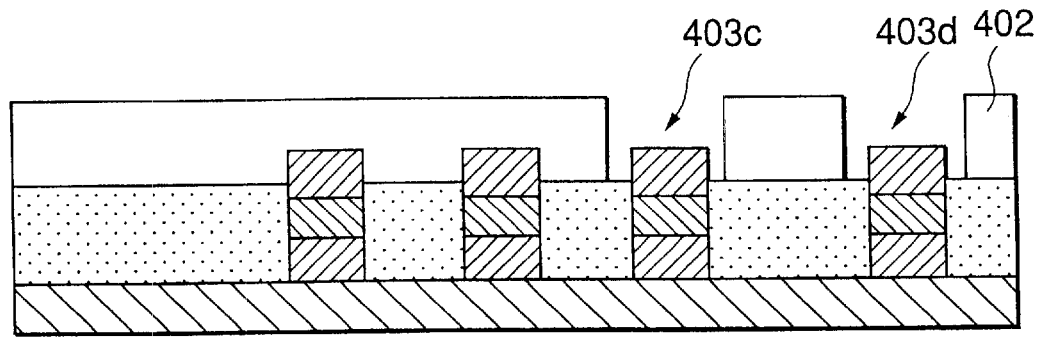
Figure 7A:
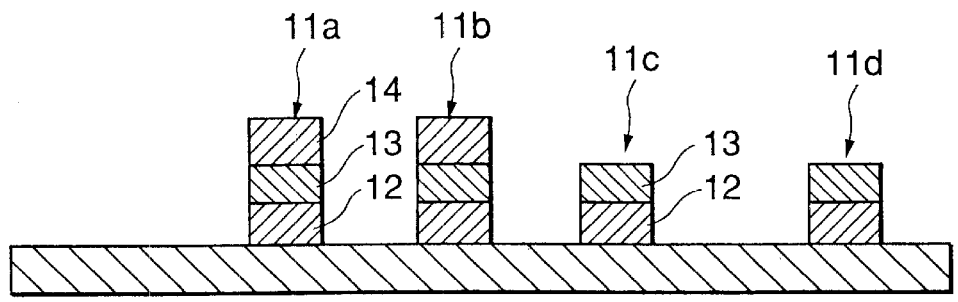
FIGS. 7(*a*) to 7(*c*) show a manufacturing process in the fourth embodiment of the method for forming contact holes according to the present invention Part 2)
Figure 7B:
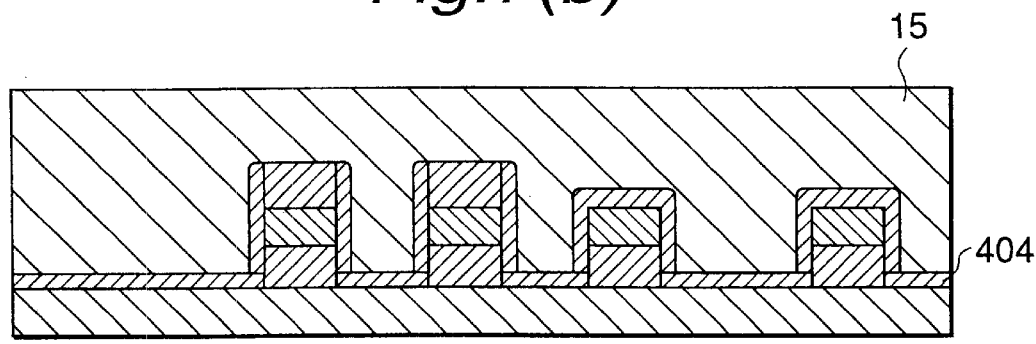
Figure 7C:
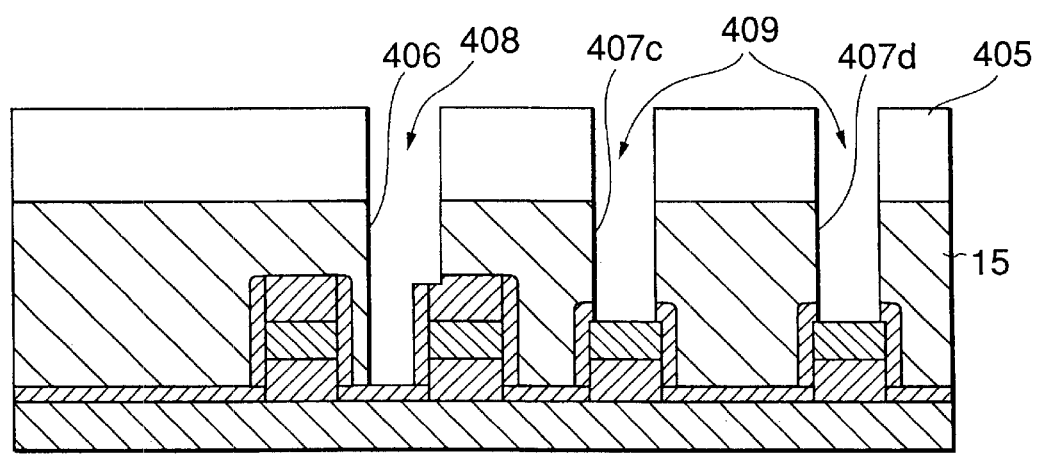
Figure 8:
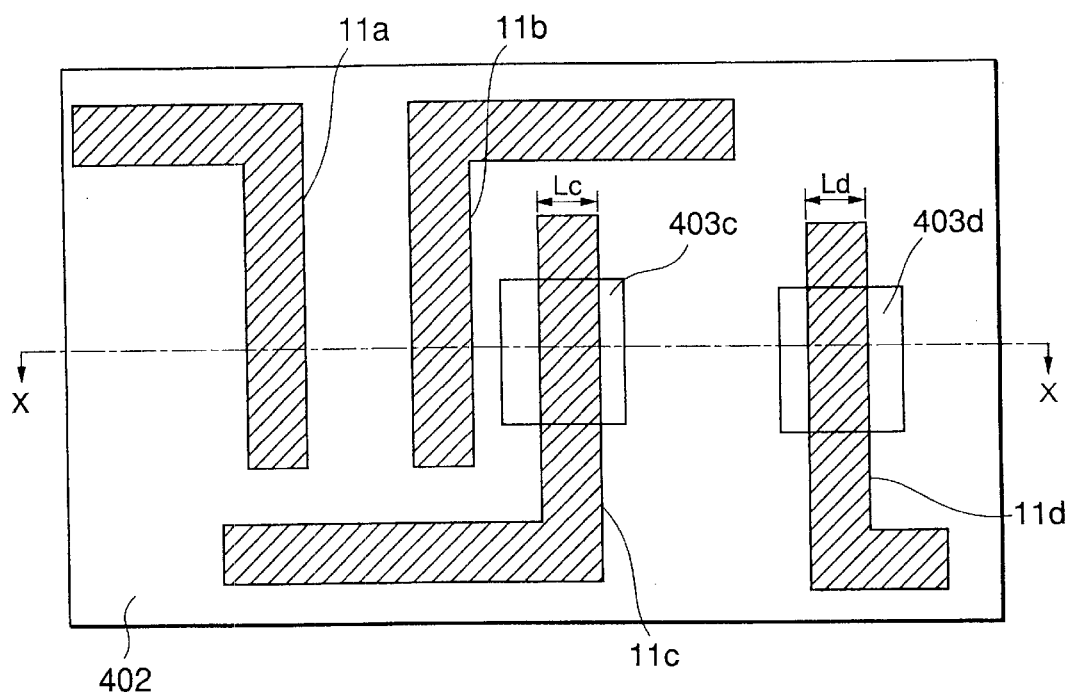
FIG. 8 is a plan view showing a semiconductor device manufacturing process in FIG. 6(*c*)
Figure 9A:
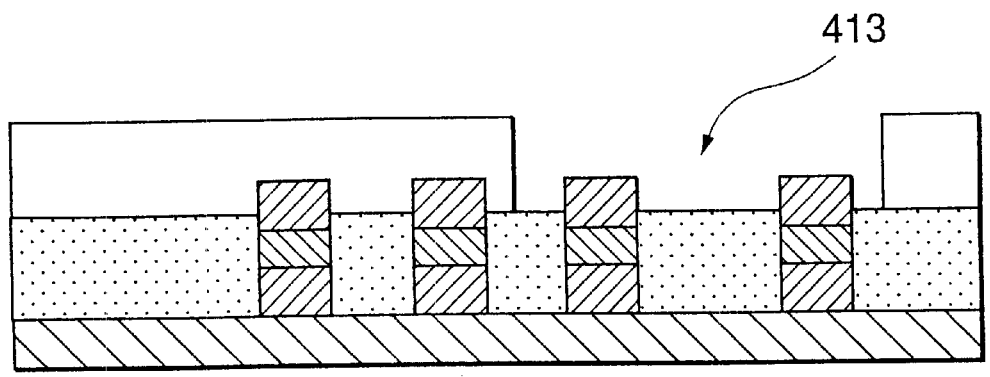
FIGS. 9(*a*) and 9(*b*) are a manufacturing-process diagram and a plan view which illustrate another example of the method for forming contact holes in FIG. 6(*c*)
Figure 9B:
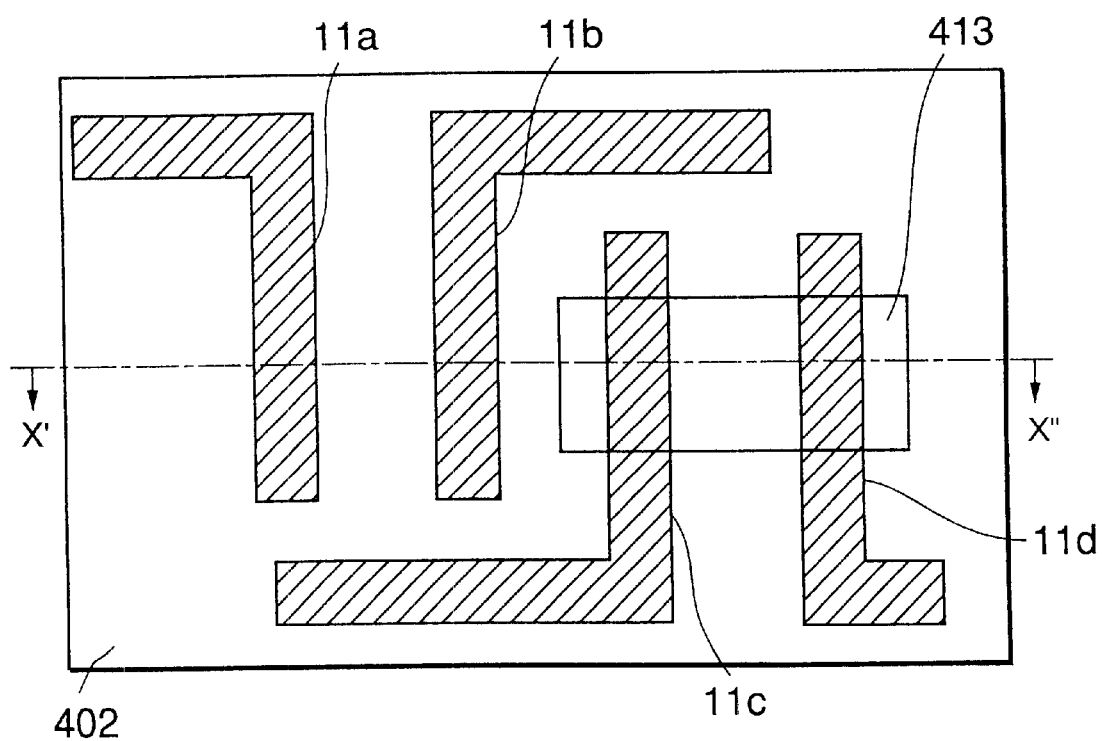

FIGS. 6 through 9 show a fourth embodiment of a semiconductor device manufacturing process according to the present invention. FIGS. 6 and 7 are cross-sectional views showing individual steps of a semiconductor device manufacturing process according to the fourth embodiment. FIG. 8 is a plan view showing a semiconductor device manufacturing process in FIG. 6(c), which is a cross-sectional view seen from X-Y in FIG. 8. FIGS. 9(a) and 9(b) respectively are a cross-sectional view and a plan view in case where a photoresist having another pattern is used in the process of FIG. 6(c).

To begin with, a method of manufacturing a semiconductor device according to the fourth embodiment will be discussed referring to FIGS. 6 and 7.

As shown in FIG. 6(a), a plurality of gate electrodes 11 (11a to 11d) for MOS transistors are formed in parallel and mutually spaced apart in an active region of a silicon semiconductor substrate 10, for example.

In the illustrated example, each gate electrode 11 has a conductor with a multi-layered structure including a polysilicon layer 12 containing an impurity and having a thickness of about 120 nm and a tungsten silicide (WSi) layer 13, which serves to increase the electric conductivity. Formed on the top surface of the conductor is a first protective film 14 of silicon nitride, for example, which has a thickness of about 160 nm. That is, the thickness of the gate electrode 11 is the total thickness of the deposited films of the stacked structure or about 380 nm. Those gate electrodes 11 are formed by, for example, depositing a gate oxide film, polysilicon and silicide in this order on the substrate 10, then forming the protective film 14 of silicon nitride on the stacked structure, and then performing selective etching with the protective film 14 used as an etching mask.

A source and drain are formed on respective sides of each gate electrode 11 in the active region of the silicon semiconductor substrate 10 where the gate electrodes 11 are provided. The source and drain are formed by injection of impurity ions by using, as a mask, each gate electrode 11 at whose top the protective film 14 is provided.

Next, as shown in FIG. 6(b), a coating film 401 which has a lower etching rate than that of the protective film 14 formed at the top surface of the conductor and is thus harder to be etched than the protective film 14 is formed on the semiconductor substrate 10 between the gate electrodes 11 by spin coating or the like. As shown in FIG. 6(c), a photoresist 402 providing window patterns 403 (403c, 403d) which expose the top surfaces of the gate electrodes 11c and 11d that should be electrically connected is formed on the coating film 401.

It is desirable that the coating film 401 to be formed by spin coating or the like should not be formed on the top surface of the gate electrode 11 and should use a film material having a viscosity which the coating film reaches a thickness that can prevent the semiconductor substrate 10 from being damaged by a later etching process of removing the protective film 14 at the top surface of the conductor. In the embodiment, the film material is such that the coating film 401 formed has a thickness of about 80 nm to 380 nm which is equal to or thinner than the thickness of the gate electrode 11.

According to the embodiment, the coating film 401 that fills up the minute clearance between the gate electrodes 11 is formed by spinning a wafer on a resist coater fast. This makes possible to form a film having a flat shape on the semiconductor substrate 10 without using planarization, such as CMP (Chemical Mechanical Polishing).

If a coating film or the like of an organic material, such as an organic film which conventionally is buried in a cylinder at the time of protecting the cylinder of a DRAM or a anti-reflection film which prevents reflection at the time of exposure, is used as the coating film 401 to be used in the embodiment, the coating film 401 can be removed in the same step of ashing a photoresist 402, which is carried out after removal of the protective films 14c and 14d on the conductor. The embodiment can therefore reliably remove unwanted protective films on the conductor without increasing the number of steps.

In case where a film of an organic material is used as the coating film, however, a photoresist 403 also of an organic material is formed on the coating film 401 after the formation of the coating film. It is therefore desirable that the material for the coating film should not cause an interaction with the resist material to be formed later.

FIG. 8 is a plan view showing the manufacturing process in FIG. 6(c) as seen from the top of the semiconductor substrate 10.

As shown in FIG. 8, the individual window patterns 403c and 403d are provided apart from each other by a given distance. In case where, for example, the gate lengths Lc and Ld of the gate electrodes 11c and 11d on which the window patterns 403 are formed are both about 0.16 μm as in the embodiment, it is desirable that the window patterns 403 should be arranged apart from each other by about 0.4 μm. The value of the distance is determined by the influence of the proximity effect or the like at the time of exposure and is needed to form a plurality of window patterns in desired shapes. In case of forming a plurality of window patterns 403 on the photoresist 402, therefore, it is desirable that the window patterns 403 are arranged apart from each other by a given distance or farther.

Even in case where a sufficient distance cannot be secured between the gate electrodes 11 on which window patterns are formed or even in case where window patterns cannot be arranged apart from each other by a given distance or farther, if window patterns which expose the protective film are designed like a window pattern 413 which exposes the protective films 14c and 14d provided on the top surfaces of the adjoining gate electrodes 11c and 11d as shown in FIG. 9, it is possible to provide window patterns that can permit elimination of the protective films 14c and 14d on the plural gate electrodes 11c, 11d. That is, the present invention can be adopted to a semiconductor device miniaturized in a greater scale.

Next, the desired protective films 14c and 14d are removed by a well-known dry etching scheme. As a then etching medium, a mixed etching gas of trifluoromethane ($CHF_3$), argon (Ar) and oxygen ($O_2$) is used. The flow rates of $CHF_3$, $O_2$ and Ar which is a rare in the mixed etching gas are adjusted to be, for example, 30 sccm, 5 to 15 sccm and 100 to 200 sccm, respectively.

The adjustment of the flow rate of $O_2$ in the mixed gas controls the selectivity of the protective film 14 to the coating film 401 to about 1.5 to 5. The mixed gas adjusted this way demonstrates a higher etching rate of the protective film 14 of silicon nitride than the etching rate of the coating film 401 containing an organic material.

Figure 10:
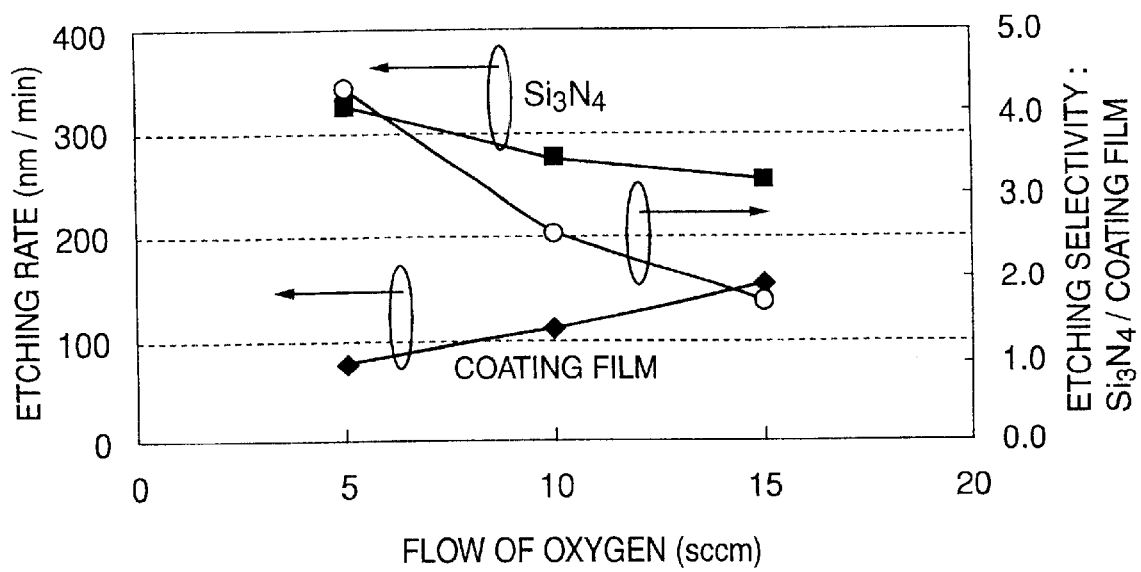
FIG. 10 is a diagram showing the dependency of the characteristic of etching of a silicon nitride film and a coating film in window patterns 403 by a mixed gas of $CF_3$, Ar and $O_2$ on a change in the flow rate of $O_2$.

The relationship between the flow rate of $O_2$ in the mixed gas and the protective film 14 of silicon nitride ($Si_3N_4$) and the coating film 401 containing an organic material will be elaborated referring to FIG. 10.

FIG. 10 illustrates the characteristic of etching of the silicon nitride film and the coating film in the window patterns 403 by the mixed gas of $CF_3$, Ar and $O_2$, and shows the dependency of the etching characteristic on a change in the flow rate of $O_2$. The etching conditions are RF power of 500 W and pressure of 18 mTorr.

The first vertical scale shows the etching rates of the silicon nitride film and the coating film while the second vertical scale shows the selectivity which is the ratio of the etching rate of one material to that of another one or the ratio of the etching rate of the silicon nitride film to that of the coating film.

As apparent from FIG. 10, increasing the flow rate of $O_2$ decreases the etching rate of the silicon nitride film but increases the etching rate of the coating film containing an organic material. This is because increasing the flow rate of $O_2$ in the mixed gas accelerates the reaction of the coating film containing an organic material with $O_2$ in the mixed gas, thus increasing the etching rate of the organic-material-contained coating film. Specifically, increasing the flow rate of $O_2$ to 15 sccm reduces the reactivity of the silicon nitride film but increases the reaction with the coating film, so that the selectivity drops to about 1.7. Decreasing the flow rate of $O_2$ to 5 sccm, on the other hand, increases the selectivity to about 5.0.

In case where the embodiment is used, the coating film 401 serves to protect the semiconductor substrate 10 at the time of performing an etching process of removing the protective films 14c and 14d on the conductor. It is therefore desirable that the ratio of the etching rate of the silicon nitride film of the protective film 14 to the etching rate of the coating film 401 or the selectivity should be designed to be about 1.5 or higher. For a portion where the distance between the adjoining gate electrodes is short or a portion where the gate width is wide, a coating film is easily formed even on the top surfaces of the protective films 14c and 14d to be removed at the time of forming the coating film by spin coating. When the selectivity is large in this case, the silicon nitride film or the protective film may remain on the conductor to be exposed. It is therefore desirable that the flow rate of $O_2$ in the etching gas for removing the protective film should be determined in consideration of the protection of the semiconductor substrate and the remaining of the protective film on the conductor at the time of etching. In one example, etching is carried out under the condition of the flow rate of $O_2$ of about 10 sccm that provides the selectivity of about 2.5.

After the protective films 14c and 14d on the desired conductor are removed, the photoresist 402 that has been used in that removal and the coating film 401 are eliminated, as shown in FIG. 7(a). The use of the aforementioned film of an organic material for the coating film 401 then can eliminate the coating film 401 in the same step of ashing a photoresist 402. The ashing condition at this time generally has only to be the one that is required to remove the photoresist. For example, ashing is executed using a parallel plate type asher for about three minutes under the conditions of the flow rate of $O_2$ of 1200 sccm, RF power of 700 W, pressure of 30 Torr and electrode temperature of 250° C.

Thereafter, as shown in FIG. 7(b), a second protective film 404 is formed of silicon nitride to have a thickness of about 20 to 80 nm using, for example, CVD. This protective film 404 serves as side walls to protect the sides of the gate electrodes at the time of forming a first contact hole 406 which exposes a semiconductor element formed on the semiconductor substrate 10.

After the protective film 404 is formed, an interlayer insulating film 15 of, for example, silicon oxide is further formed to bury the protective film 404. The surface of the interlayer insulating film 15 undergoes a planarization process.

Formed on the surface of the interlayer insulating film 15 subjected to planarization is an etching mask 405 which has an opening 408 through which the first contact hole 406 for exposing the source and drain formed in the active region of the substrate between the desired gate electrodes 11 is formed in a self-aligned contact process and an opening 409 through which the second contact hole 407 for exposing the top surface of the desired conductor is formed. In the illustrated example, the first contact hole 406 is formed between the gate electrodes 11a and 11b and the second contact holes 407a and 407b are respectively formed on the gate electrodes 11c and 11d.

The insulating film 15 is etched by selective etching with the etching mask 405. As an etching medium, a CF-based etching gas, for example, is used.

This etching gas exhibits a sufficiently higher etching rate to the insulating film 15 of silicon oxide than to the protective film 14 of silicon nitride. When that portion of the insulating film 15 which corresponds to the opening 408 of the etching mask 405 is removed and consequently some part of the top portion, the side-wall portions and the bottom portion of the gate electrode 14b are exposed to the etching gas, therefore, the thin bottom portion on the semiconductor substrate 10 and the second protective film at the top surfaces of the gate electrodes 14c and 14d from which the first protective film 14 has been removed beforehand are removed in a relatively short time. But, the protective film on the top portion and side-wall portions of the gate electrode 11b, excluding that bottom portion, remains after removal.

As has been well known, therefore, the top portion and the side-wall portions of the gate electrode 11b function substantially as etching stoppers. Therefore, as shown in FIG. 7(c), the desired first contact hole 406 is accurately formed between the gate electrodes 11a and 11b by the etching stopper action of the protective film 14 provided in conjunction with the gate electrodes 11 regardless of the placement accuracy of the etching mask 405. Using the same etching mask 405, the second contact holes 407 which expose the conductors are formed in the top surfaces of the gate electrodes 11c and 11d from which the protective film has been removed beforehand.

Then, plugs 18 as conductors are formed to fill up the contact holes. The plugs 18 are made of, for example, impurity-doped polysilicon and an electric path that constitute multi-level interconnection lines is formed, as needed, on the insulating film 15 from which the etching mask 405 has been removed.

According to the contact-hole forming method of the fourth embodiment, as apparent from the above, at the time the protective film 14 on the top surface of the conductor that provides electric connection is removed, the penetration of the opening to the semiconductor substrate 10 due to the excessive elimination of the coating film 401 can be suppressed by using an etching gas which demonstrates an etching rate associated with the protective film 14 which is higher than the etching rate associated with the coating film 401 formed beforehand, as per the previous embodiment.

In the process of forming the contact holes 406 and 407 that expose the active region on the semiconductor substrate 10 and the top surfaces of conductors, the protective films on the conductors have been removed beforehand, so that the insulating film 15 and the thin protective film 14 can be removed using a single etching gas without switching the etching gas. This inhibits the formation of a carbon film on the protective film which would conventionally be caused by the switching of the etching gas. Accordingly, the conventional carbon-film originated etch stop will not occur, so that the contact holes 406 and 407, which expose the semiconductor substrate 10 and the conductors, can be formed suitably.

In this embodiment, the protective films 14c and 14d formed on the top surfaces of the desired conductors are removed beforehand by using the coating film 401 that is formed of a material with a good coating property. As compared with the previously described embodiment, therefore, the fourth embodiment can eliminate a process of planarizing the insulating film using CMP or the like. This improves the yield and can provide a more stable mass-production process. Further, the use of a coating film of an organic material can permit the coating film to be removed in the photoresist ashing process that has been performed in the related art. It is therefore possible to eliminate the protective film on the conductor without requiring an additional step.

According to the contact-hole forming method of the fourth embodiment, the protective films are formed on the side walls of the gate electrodes 11c and 11d in the top surfaces of which the contact holes 407 are formed and the first and second contact holes are then formed at the same time. This can also provide the gate electrodes 11c and 11d with an alignment margin by the protective films on the side walls. The embodiment can therefore form contact holes which do not have an alignment margin with respect to the gate electrodes 11 or can form contact holes whose diameters are approximately equal to the gate length. Accordingly, the embodiment can easily cope with the future demand for further miniaturization of semiconductor devices.

Figure 11A:
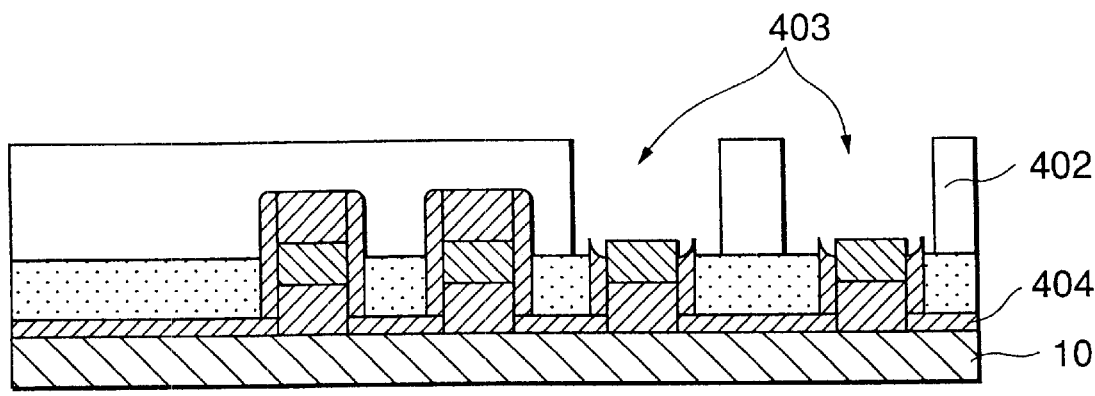
FIGS. 11(*a*) and 11(*b*) show a manufacturing process of a further example of the fourth embodiment of the method for forming contact holes according to the present invention.

According to the fourth embodiment, the silicon nitride film of the second protective film 404 that becomes a side wall is formed after the protective films 14c and 14d on the conductors that provide electric connection are removed. According to the fourth embodiment, however, the second protective film 404 that becomes a side wall may be formed before removal of the protective film on the conductor, as shown in FIG. 11(a).

Figure 11B:
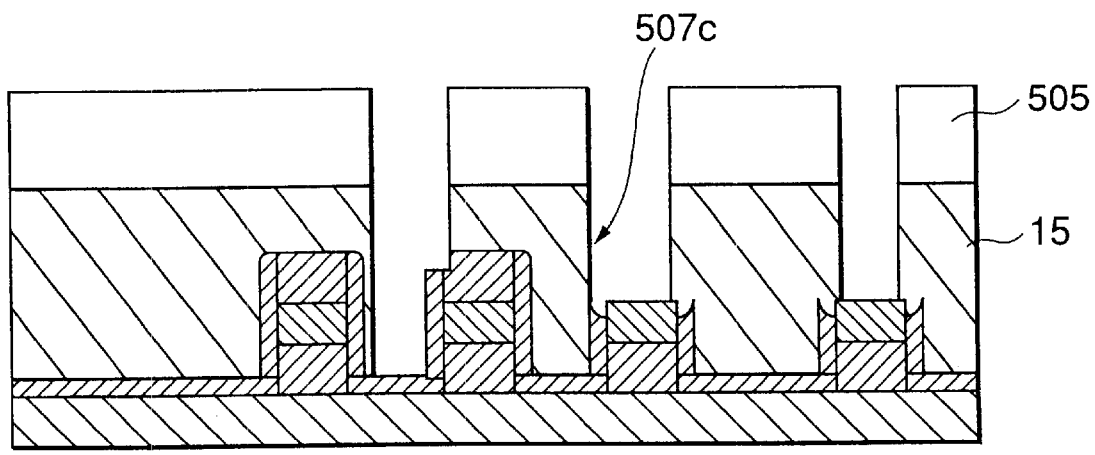

In such a case, however, the side walls of the gate electrodes 11c and 11d from the top surfaces of which the protective films are to be removed have such patterns that the height from the semiconductor substrate 10 at a portion apart from the gate electrode 11 is higher than the height from the semiconductor substrate 10 at a portion that contacts the gate electrode 11, unlike the patterns of the ordinary side walls (the height from the semiconductor substrate at a portion that contacts the gate electrode is higher than the height from the semiconductor substrate at a portion apart from the gate electrode). That is, another manufacturing method of the fourth embodiment provides a semiconductor device in which a part of the side wall of a conductor is exposed as shown in FIG. 11(b).

This is because a coating film whose etching rate is lower than the etching rate of the protective film is formed at the end portion of the protective film 14 which is located apart from the gate electrode 11 at the time of removing the protective film 14c, 14d on the top surface of the conductor, and in the etching process of removing the protective film 14, removal of the protective film closer to the gate electrode 11 where the coating film is not formed starts after which the protective film at a portion apart from the gate electrode 11 where the coating film 401 at the end portion has been eliminated is removed. The then etching conditions for removing the protective film are, for example, the etching gas of $CHF_3/Ar/O_2=30/170/10$ sccm and pressure of 30 to 50 mTorr.

Even in case where the opening position of a contact hole 507c which exposes the top surface of the conductor is slightly shifted due to the deviation or the like of the forming position of an etching mask 505, the thus constituted semiconductor device which has side walls so designed to expose the side wall of a part of a conductor can provide electric connection to a plug formed in the contact hole 507 at the side-wall portions of the gate electrode 11c that is exposed through the side walls, as compared with the semiconductor device which has side walls with ordinary patterns and is manufactured by the fourth embodiment. This can establish electric connection of the gate electrode 11c to the plug without increasing the contact resistance.

According to the present invention, as described above, by having the specified portions of the protective film removed in advance, it becomes possible to carry out a final etching process to form the first contact hole and the second contact hole under the same condition in such a way that the former is open to the semiconductor substrate and the latter passes through the protective film and is open to the gate electrode. Therefore, it is possible to form both contact holes using a single etching mask for the final etching process.

For this reason, the relative position of the two contact holes is determined by the accuracy of the pattern of the mask, so that painful effort for positioning separate masks for forming the first and second contact holes becomes unnecessary. Thus, positioning work of the two masks with high accuracy can be done away with and the first and second contact holes can be formed accurately with relative ease.

What is claimed is:

1. A method for forming contact holes comprising:
providing a substrate where a semiconductor element is formed;
forming first, second and third conductors on said substrate, located apart from one another;
forming a first protective film on top surfaces of said conductors;
forming a second protective film on side surfaces of said conductors and said first protective films;
forming a coating film on said substrate, which has a thickness approximately equal to or smaller than a sum of a thickness of said conductors and a thickness of said first protective film and has an etching rate lower than an etching rate of said first and second protective films;
forming a resist mask on said coating film which covers said protective films formed on said first and second conductors and which exposes said protective films formed on said third conductors;
exposing said top surface of said third conductor by performing etching using said resist mask;
removing said resist mask and said coating film;
forming an insulating film on said substrate including said conductors after removing said resist mask and said coating film; and
forming, in said insulating film, a first contact hole which exposes said semiconductor element located between said first and second conductors, and a second contact hole which exposes said top surface of said third conductor.

2. A method for forming contact holes according to claim 1, wherein said first contact hole and said second contact hole are formed by using a single etching mask.

3. A method for forming contact holes according to claim 1, wherein said coating film is coated while spinning said substrate.

4. A method for forming contact holes according to claim 1, wherein said thickness of said coating film is approximately 80 nm or greater and said etching rate of said protective film is approximately 1.5 times said etching rate of said coating film or higher.

5. A method for forming contact holes according to claim 1, further comprising forming a third contact hole in said insulating film which exposes top surface of a fourth conductor having said first protective film located next to said third conductor, and said opening expose said first protective film formed on said third and fourth conductors.

6. A method for forming contact holes according to claim 1, further comprising planarizing said insulating film before formation of said first and second contact holes.

7. A method for forming contact holes according to claim 1, wherein said coating film is formed of an organic material, and is removed together with said resist mask in an ashing step of removing said resist mask.

8. A method for forming contact holes according to claim 7, wherein an etching medium used in etching to remove said protective film on said top surfaces of said conductors contains oxygen.

9. A method for forming contact holes according to claim 8, wherein said etching medium is a mixed gas containing trifluoromethane, argon and oxygen.

10. A method for forming contact holes according to claim 9, wherein flow rates of trifluoromethane and argon in said mixed gas are controlled to be about 30 sccm and about 100 to 200 sccm, respectively, and a flow rate of oxygen in said mixed gas is controlled to be about 5 to 15 sccm.

11. A method for forming contact holes comprising:

providing a substrate where a semiconductor element is formed;

forming first, second and third conductors on said substrate, located apart from one another;

forming a first protective film on top surfaces of said conductors;

forming a coating film on said substrate, which has a thickness approximately equal to or smaller than a sum of a thickness of said conductors and a thickness of said first protective film and has an etching rate lower than an etching rate of said first protective film;

forming a resist mask on said coating film which covers said first protective film formed on said first and second conductors and which exposes said first protective film formed on said third conductors;

exposing said top surface of said third conductor by performing etching using said resist mask;

removing said resist mask and said coating film;

forming a second protective film on side surfaces of said conductors after removing said resist mask and said coating film;

forming an insulating film on said substrate including said conductors after forming said second protective film; and forming, in said insulating film, a first contact hole which exposes said semiconductor element located between said first and second conductors, and a second contact hole which exposes said top surface of said third conductor.

12. A method for forming contact holes according to claim 11, wherein said first contact hole and said second contact hole are formed by using a single etching mask.

13. A method for forming contact holes according to claim 11, wherein said coating film is coated while spinning said substrate.

14. A method for forming contact holes according to claim 11, wherein said thickness of said coating film is approximately 80 nm or greater and said etching rate of said protective film is approximately 1.5 times said etching rate of said coating film or higher.

15. A method for forming contact holes according to claim 11, further comprising forming a third contact hole in said insulating film which exposes top surface of a fourth conductor having said first protective film located next to said third conductor, and said opening expose said first protective film formed on said third and fourth conductors.

16. A method for forming contact holes according to claim 11, further comprising planarizing said insulating film before formation of said first and second contact holes.

17. A method for forming contact holes according to claim 11, wherein said coating film is formed of an organic material, and is removed together with said resist mask in an ashing step of removing said resist mask.

18. A method for forming contact holes according to claim 17, wherein an etching medium used in etching to remove said protective film on said top surfaces of said conductors contains oxygen.

19. A method for forming contact holes according to claim 18, wherein said etching medium is a mixed gas containing trifluoromethane, argon and oxygen.

20. A method for forming contact holes according to claim 19, wherein flow rates of trifluoromethane and argon in said mixed gas are controlled to be about 30 sccm and about 100 to 200 sccm, respectively, and a flow rate of oxygen in said mixed gas is controlled to be about 5 to 15 sccm.

* * * * *